(12) United States Patent
Waggener, Jr.

(10) Patent No.: US 10,802,552 B2
(45) Date of Patent: Oct. 13, 2020

(54) VACUUM PROTECTED FLIGHT RECORDER MEMORY

(71) Applicant: L3 Technologies, Inc., New York, NY (US)

(72) Inventor: William N. Waggener, Jr., Sarasota, FL (US)

(73) Assignee: L3 TECHNOLOGIES, INC., New York, NY (US)

( * ) Notice: Subject to any disclaimer, the term of this patent is extended or adjusted under 35 U.S.C. 154(b) by 208 days.

(21) Appl. No.: 15/796,614

(22) Filed: Oct. 27, 2017

(65) Prior Publication Data

US 2019/0129477 A1    May 2, 2019

(51) Int. Cl.
| | | |
|---|---|---|
| G06F 1/18 | (2006.01) |
| B64D 45/00 | (2006.01) |
| H05K 5/02 | (2006.01) |
| G07C 5/08 | (2006.01) |

(52) U.S. Cl.
CPC ............ *G06F 1/182* (2013.01); *B64D 45/00* (2013.01); *H05K 5/0213* (2013.01); *B64D 2045/0065* (2013.01); *G07C 5/085* (2013.01)

(58) Field of Classification Search
CPC B64D 2045/0075; B64D 45/00; B64D 37/04; B64D 43/00; B64D 2045/0065; B64D 2045/0085; G06F 1/182; G06F 1/16; H05K 5/0213; H05K 5/0217; H05K 5/0247
See application file for complete search history.

(56) References Cited

U.S. PATENT DOCUMENTS

| | | | |
|---|---|---|---|
| 3,207,354 A | | 9/1965 | Skinner |
| 3,906,370 A | * | 9/1975 | Apps .................. G01S 1/68 206/523 |
| 4,944,401 A | * | 7/1990 | Groenewegen ...... H05K 5/0213 174/544 |
| 5,123,538 A | | 6/1992 | Groenewegen |

(Continued)

FOREIGN PATENT DOCUMENTS

| | | |
|---|---|---|
| EP | 2361002 | 8/2011 |
| GB | 2151410 | 7/1985 |
| WO | 8503583 | 8/1985 |

OTHER PUBLICATIONS

International Search Report/Written Opinion dated Jan. 18, 2019 by the European Patent Office/International Searching Authority on related international patent application PCT/US2018/057835 international filing date Oct. 26, 2018.

*Primary Examiner* — Anthony M Haughton
(74) *Attorney, Agent, or Firm* — Dickinson Wright PLLC

(57) ABSTRACT

Various systems may benefit from appropriate thermal protection. For example, various flight recorder systems may benefit from a vacuum protected flight recorder memory. A system can include a memory core of a flight recorder. The system can also include an inner chamber housing the memory core. The system can further include an outer chamber housing the inner chamber with a vacuum between the inner chamber and the outer chamber. The system can additionally include a signal path from avionics equipment to the memory core through the outer chamber and the inner chamber. The system can also include a power path for the memory core through the outer chamber and the inner chamber.

11 Claims, 3 Drawing Sheets

ELEMENTS OF VACUUM MEMORY PROTECTION

(56) References Cited

U.S. PATENT DOCUMENTS

| | | | |
|---|---|---|---|
| 5,366,105 A * | 11/1994 | Kerman | F41J 13/00 |
| | | | 220/62.11 |
| 5,508,922 A | 4/1996 | Clavelloux et al. | |
| 5,552,608 A * | 9/1996 | Gallagher | F17C 3/085 |
| | | | 250/352 |
| 6,153,720 A | 11/2000 | Olzak | |
| 8,670,879 B1 * | 3/2014 | Angelucci | B64D 45/00 |
| | | | 244/1 R |
| 2006/0272838 A1 * | 12/2006 | Sauerzweig | H05K 5/0213 |
| | | | 174/17 SF |
| 2007/0095543 A1 | 5/2007 | Tchakarov | |
| 2007/0159789 A1 * | 7/2007 | Schuette | G06F 1/206 |
| | | | 361/679.31 |
| 2011/0068644 A1 | 3/2011 | Kamp | |
| 2014/0290474 A1 * | 10/2014 | Citterio | F41H 5/0428 |
| | | | 89/36.02 |
| 2016/0242598 A1 | 8/2016 | Alexander | |
| 2018/0105063 A1 | 4/2018 | Wei et al. | |

\* cited by examiner

VACUUM PROTECTED FLIGHT RECORDER MEMORY

BACKGROUND

Field

Various systems may benefit from appropriate thermal protection. For example, various flight recorder systems may benefit from vacuum protected flight recorder memory.

Description of the Related Art

When aircraft crash, one highly critical source of information regarding the crash comes from the flight recorder. In order to be valuable, therefore, flight recorders are designed to have memories that are crash survivable.

Industry demand is trending towards a desire for larger and crash survivable memory capacities to support multiple long duration voice and video channels and other data. At the same time, large sized commercial memories, when tested, are having difficulties passing temperature testing requirements.

BRIEF DESCRIPTION OF THE DRAWINGS

For proper understanding of the invention, reference should be made to the accompanying drawings, wherein.

SUMMARY

Figure 1:
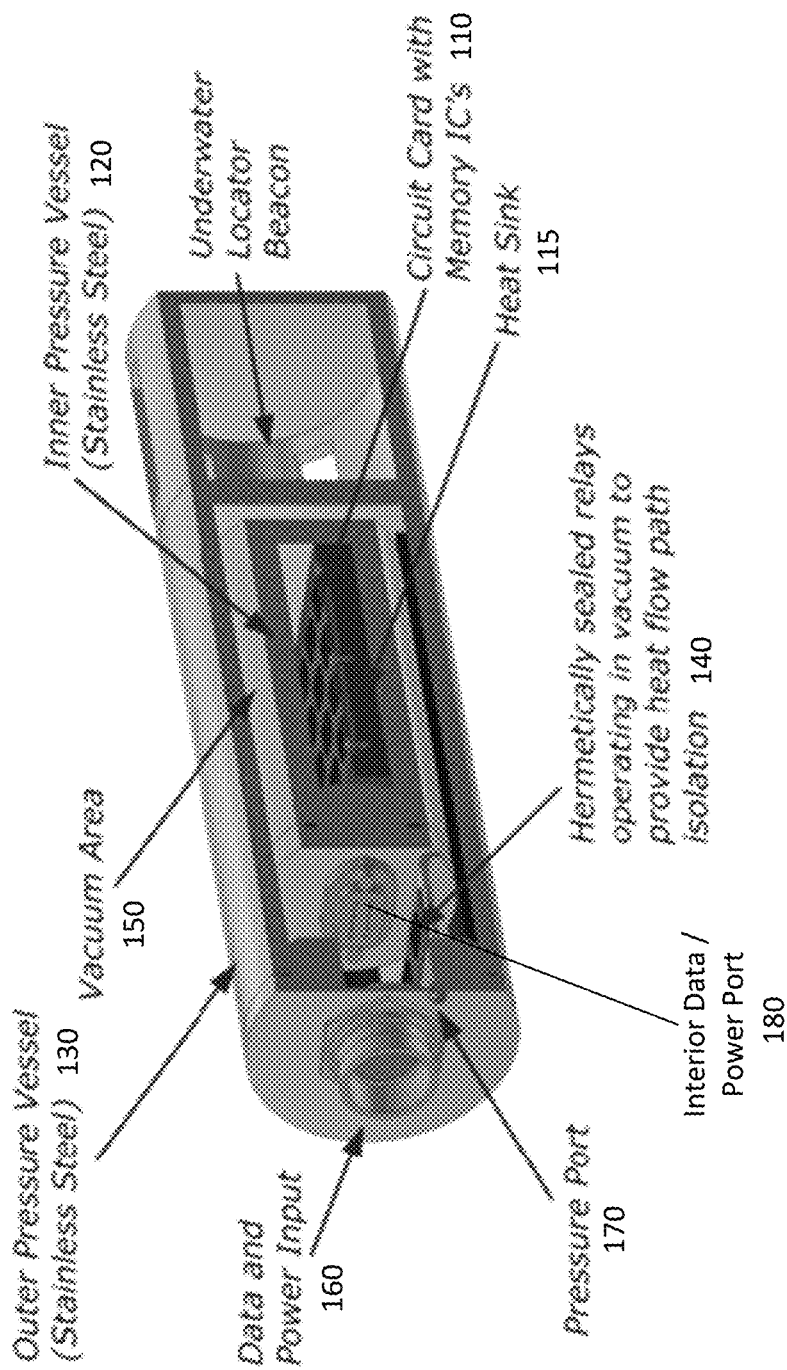
FIG. 1 illustrates an embodiment of a vacuum protected memory, according to certain embodiments of the present invention.

According to certain embodiments of the present invention, a system can include a memory core of a flight recorder. The system can also include an inner chamber housing the memory core. The system can further include an outer chamber housing the inner chamber with a vacuum between the inner chamber and the outer chamber. The system can additionally include a signal path from avionics equipment to the memory core through the outer chamber and the inner chamber. The system can also include a power path for the memory core through the outer chamber and the inner chamber.

DETAILED DESCRIPTION

Certain embodiments of the present invention relate to flight recorders that can survive temperature tests required by regulation. An example of such regulations is EUROCAE ED-112A, "Minimum Operational Performance Specification for Crash Protected Airborne Recorder Systems."

For example, certain embodiments of the present invention relate to a flight recorder memory concept that can provide memory protection from temperature extremes using vacuum as an insulating medium. Certain embodiments of the present invention, therefore, may allow for the use of higher capacity memory technologies that do not currently survive the required fire tests, such higher capacity memory technologies including but not limited to the following: non-volatile memory such as NVRAM, which can be an example of flash memory, solid-state storage; read only memory (ROM) such as EPROM, EEPROM, masked ROM, and PROM; and volatile memory such as SRAM and DRAM. These memories can all be protected even if they are not the actual chips storing the flight data. Sometimes other integrated circuits and memories are contained within the Crash Survivable Memory Unit (CSMU) that are part of the overall circuitry used in storing data.

The core of the recorder memory architecture can use any desired vacuum flask, such as a Dewar flask or Dewar bottle, named after Sir James Dewar, who is credited with their invention in 1892. Using this approach, conduction and convection of heat may be almost eliminated. Radiated heat can be reduced by use of additional techniques, such as silvering, other reflective techniques or any other desired technique.

In one exemplary embodiment, memory electronics can be housed in an inner core. The inner core can be surrounded by an outer core, with a vacuum separating the two cores. This vacuum separation can be accomplished in any of a variety of ways.

For example, memory electronics which may be housed in an inner core can be inserted into another, larger diameter pressure vessel and sealed. The space between the inner core and the outer vessel can have the air there between evacuated. Another approach may provide concentric vessels (e.g., cylindrical vessels or any other desired shape) that can be sealed at the ends and have the air between them be pumped out through a valve. In a further implementation, concentric vessels (e.g., cylindrical vessels or any other desired shape) can be welded at the open ends in a vacuum space, using electron beam welding, thereby trapping a vacuum between the cylinders. The vessels need not be cylindrical, and therefore, a multitude of shapes can be used for application specific requirements.

Signal communication to the memory core can be done electrically by traditional copper wiring. Alternatively, fiber optic cable can be used, thereby eliminating copper intrusion into the memory core. Power to the memory core can be provided by traditional wiring and can employ techniques for heat path conduction isolation, such techniques for heat path conduction isolation including, without limitation, power transfer via magnetic or electric field. Some specific examples include electromagnetic induction, electrodynamic induction, electrostatic induction, inductive coupling, magnetic resonant induction, microwave power, radio frequency (RF) power, and light or laser power.

FIG. 1 illustrates a vacuum protected memory, according to certain embodiments of the present invention. As shown in FIG. 1, there can be a circuit card with memory integrated circuits (ICs) 110 installed within an inner pressure vessel 120. In this particular illustration, the inner pressure vessel 120 is stainless steel, but other materials are also permitted. Optionally, the inner pressure vessel 120 may be made of a thermally insulating material, such thermally insulating material which may comprise, without limitation, ceramic insulation, which can be covered with an airtight (vacuum resistant) covering such as glass or metal. The memory 110 can be provided with a heat sink 115 which may also be located within the inner pressure vessel 120.

The inner pressure vessel 120 can be housed within an outer pressure vessel 130, which is illustrated as being made of stainless steel, although other materials are also permitted. One or more hermetically sealed relay(s) 140 can operate in a vacuum 150 between the inner pressure vessel 120 and the outer pressure vessel 130. The relay(s) 140 can provide heat flow path isolation. The outer pressure vessel 130 can include a data and power input port 160, as well as a pressure port 170. The pressure port 170 can be used for removing air from between the vessels, thereby creating a vacuum 150 between the inner pressure vessel 120 and the outer pressure vessel 130.

The data and power lines are not shown, but can be connected from the data and power input to the interior data/power port 180 of the inner pressure vessel 120. As mentioned above, one or more hermetically sealed relay(s) 140 can be used to provide heat flow path isolation with respect to, for example, the power lines.

An underwater locator beacon can be attached to one end of the outer pressure vessel 130. In this example, the underwater locator beacon is located at an opposite end of the outer pressure vessel 130 from the data and power input, but the underwater locator beacon could be provided at the same end, or at any other desired location on the outer pressure vessel 130 or indeed at any other part of the entire structure of the vacuum protected memory depicted in FIG. 1.

Figure 2:
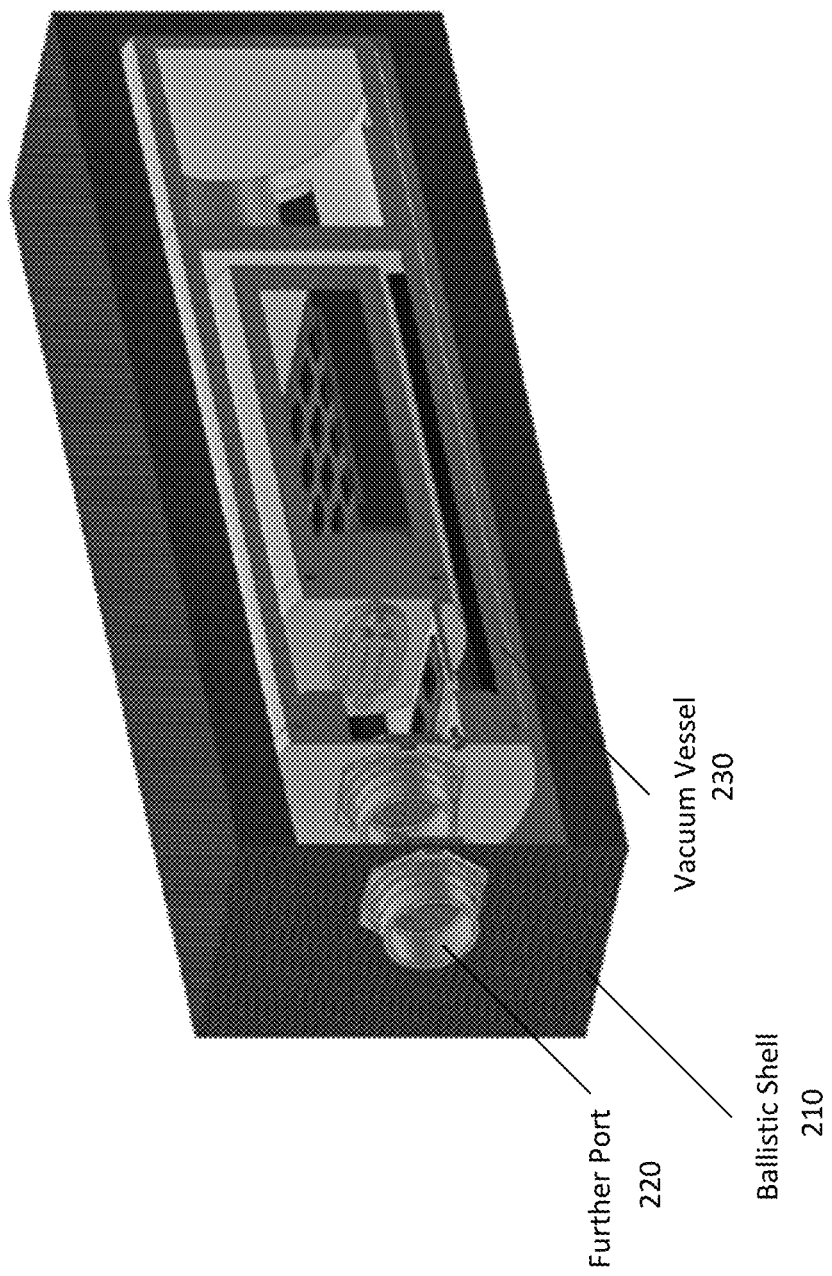
FIG. 2 illustrates a further embodiment of a vacuum protected memory, according to certain embodiments of the present invention.

FIG. 2 illustrates a further embodiment of a vacuum protected memory, according to certain embodiments of the present invention. As shown in FIG. 2, the device can include a vacuum protected memory which can be constructed, for example, as shown and described in FIG. 1.

As also shown in FIG. 2, the device can further include a ballistic shell 210 with a further port 220. The further port can provide the same connectivity as the data and power input power port of the outer vessel 230.

The ballistic shell 210 can be designed to further protect the vacuum protected memory from crash forces and penetrating forces. For example, the ballistic shell 210 can encase the vacuum protected memory module with any desired structure, such as an aluminum honeycomb sandwich, to provide resistance to ballistic penetration.

The use of this ballistic shell 210 can be consistent with a progressive protection philosophy. For example, kinetic energy absorption can be provided by the shell, and this can be followed by technologies incorporated for flame protection and high residual heat protection, such as the region of established vacuum.

According to certain embodiments of the present invention, a system can include a memory core for a flight recorder. This memory core can include any desired memory, such as memory integrated circuits, as illustrated in FIGS. 1 and 2.

The system can also include an inner chamber housing the memory core. This inner chamber may be, for example, the inner pressure vessel 120 described above. Any desired heat sink can be provided for the memory core. The heat sink can be provided within the inner chamber. The heat sink can be designed to transmit heat to the wall of the inner chamber.

The system can further include an outer chamber housing the inner chamber with a vacuum between the inner chamber and the outer chamber. The outer chamber may be, for example, the outer pressure vessel described above.

The inner chamber and the outer chamber can be cylinders. Other form factors are also permitted. For example, the form factor could be other three-dimensional concentric shapes, such as concentric boxes (e.g., rectangular, triangular, or square), or even concentric spheres. Embodiments of the present invention may not require that the shape of the inner chamber match the shape of the outer chamber. For example, a square box inner chamber could be housed by a rectangular box outer chamber.

The inner chamber can be set off from the outer chamber by one or more insulating supports. These insulating supports may be, for example, insulating washers or other supports (e.g., ring-shaped supports) that set off the walls of the inner chamber from the walls of the outer chamber, so that there is no direct physical contact between the walls.

The inner chamber and the outer chamber can each be stainless steel, titanium, other similar materials or any other desired materials. Alternatively, the inner chamber may be made from a different material than the outer chamber. In either case, the materials can be selected as having good structural strength.

An inner surface of the outer chamber can be coated with a material that absorbs radiant heat better than the material of the outer chamber, such as a black material or any other material with the desired heat absorption traits. By contrast, an outer surface of the inner chamber can be coated with a material that reflects radiant heat better than the material of the inner chamber, such as a silver surface, a mirror surface or any other material with the desired heat-related traits.

The system can also include a signal path from avionics equipment to the memory core through the outer chamber and the inner chamber.

The system can further include a power path for the memory core through the outer chamber and the inner chamber.

As mentioned above, an underwater locater beacon can be provided at one end of the outer chamber. A ballistic casing can be provided around the outer core, as illustrated in FIG. 2. The ballistic casing can have an aluminum honeycomb structure, or any other similar force-absorbing structure. The ballistic casing may be made from or impregnated with a fire-retardant material that is designed to prevent burning of the ballistic casing.

Figure 3:
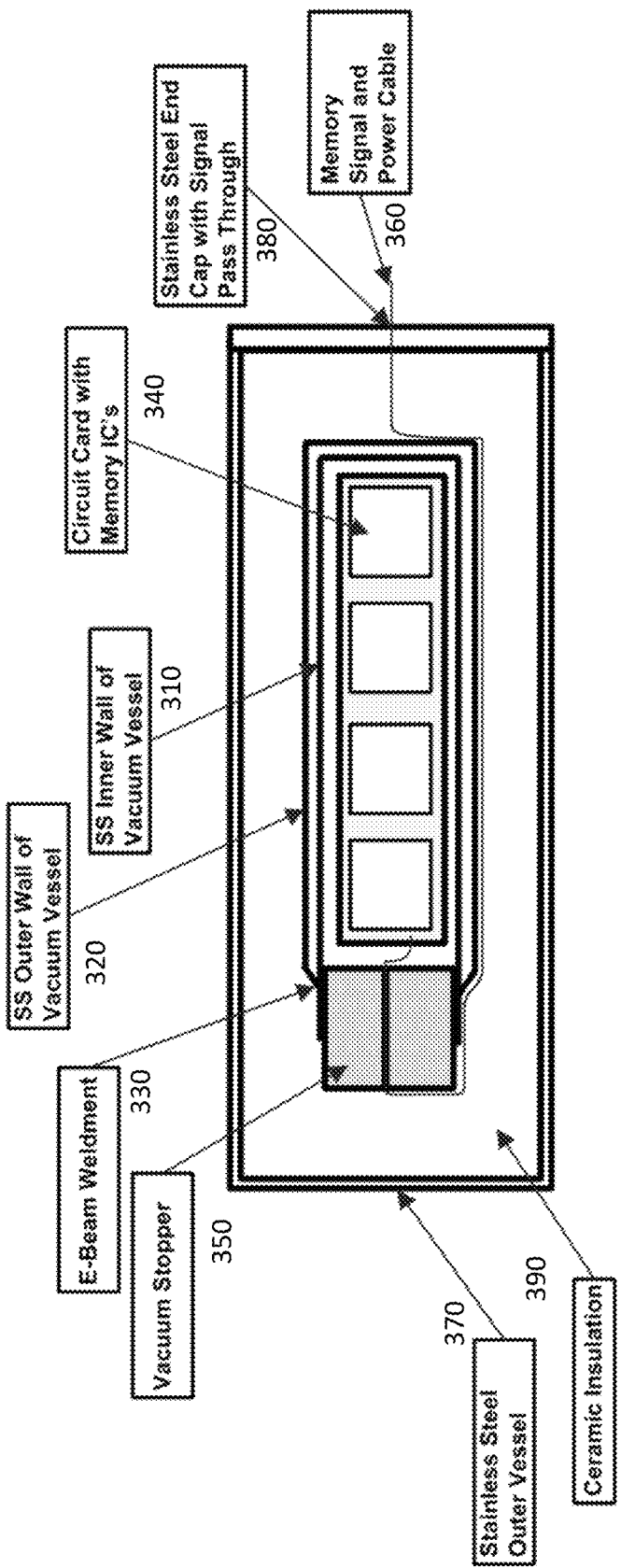
FIG. 3 illustrates an additional embodiment of a vacuum protected memory, according to certain embodiments of the present invention.

As illustrated in FIG. 3, an inner vacuum vessel can be constructed of two concentric stainless steel tubes. As mentioned above, other materials, such as Titanium are also permitted, and other shapes than tubes are permitted. The difference in radius between the outside of the inner tube 310 and inside of the outer tube 320 can serve as the vacuum zone. A thermally insulating spacer or spacers can establish a standoff between the two tubes.

The larger tube can be necked down or pinch rolled onto the inner tube and electron beam welded 330 in a vacuum space. A so-called getter material can be included in the vacuum zone to further enhance the quality of the vacuum. As mentioned above, the outer surface of the inner vessel may be reflective, silvered or otherwise configured to reflect radiant heat.

A circuit card for memory 340 can be inserted into the inner space in the vacuum vessel and the vessel can be stoppered with a stopper 350 made of high temperature insulating material, such as ceramic, high temperature polymers, or a dewar stopper made of metal with a cavity in the middle which is a vacuum space. The circuit card 340 can be mounted to a heat sink for circuit generated heat dissipation. Signal and power cable(s) 360 can lead out of the stopper and run down the side of the vacuum vessel.

A stainless steel outer vessel 370 can be constructed from s/s tubing and filled with ceramic insulation material from Thermal Ceramics or Advanced Ceramics. The shape of the ceramic insulation material can match the vacuum vessel.

The vacuum vessel can be inserted into the outer vessel 370, stopper 350 first. In this arrangement, the payload may be farthest from the stopper 350, and the stopper 350 side may be farthest away from the outer vessel end cap 380 side. The signal cable 360 can be run out of the outer vessel end cap.

In this arrangement, the outer vessel 370 can handle the penetrating and crush testing, and the ceramic insulation 390 can provide a backup in case the vacuum is lost in some way. Another option would be to fill up (or partially fill up) the vacuum vessel with gelatin. Filling the inside of the vacuum vessel with material such as thermally conductive grease or added heat sink(s) could also be a further (unillustrated) option.

One having ordinary skill in the art will readily understand that the invention, as discussed above, may be practiced with steps in a different order, and/or with hardware elements in configurations which are different than those which are disclosed. Therefore, although the invention has been described based upon these disclosed embodiments, it would be apparent to those of skill in the art that certain modifications, variations, and alternative constructions would be apparent, while remaining within the spirit and scope of the invention.

I claim:

1. A system, comprising:
   a memory core of a flight recorder;
   an inner chamber housing the memory core;
   an outer chamber housing the inner chamber with a vacuum between the inner chamber and the outer chamber;
   a signal path from avionics equipment to the memory core through the outer chamber and the inner chamber; and
   a power path for the memory core through the outer chamber and the inner chamber;
   wherein an outer surface of the inner chamber is coated with a silvering material configured to reflect radiant heat.

2. The system of claim 1, wherein the inner chamber and the outer chamber are cylinders, concentric boxes, or concentric spheres.

3. The system of claim 1, wherein the inner chamber is set off from the outer chamber by one or more insulating supports.

4. The system of claim 1, wherein outer chamber comprises stainless steel or titanium.

5. The system of claim 1, wherein an inner surface of the outer chamber is coated with a black material that is configured to absorb radiant heat.

6. The system of claim 1, wherein the inner chamber comprises stainless steel or titanium.

7. The system of claim 1, further comprising an underwater locater beacon.

8. The system of claim 7, wherein the underwater locater beacon is located at one end of the outer chamber.

9. The system of claim 1, further comprising:
   a heat sink provided for the memory core and located within the inner chamber.

10. The system of claim 1, further comprising:
    a ballistic casing provided around the outer core.

11. The system of claim 10, wherein the ballistic casing comprises an aluminum honeycomb structure.

* * * * *